(12) United States Patent
Wada et al.

(10) Patent No.: US 7,833,348 B2
(45) Date of Patent: Nov. 16, 2010

(54) TEMPERATURE CONTROL METHOD OF EPITAXIAL GROWTH APPARATUS

(75) Inventors: Naoyuki Wada, Tokyo (JP); Hiroyuki Kishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 675 days.

(21) Appl. No.: 11/533,889

(22) Filed: Sep. 21, 2006

(65) Prior Publication Data

US 2007/0062439 A1    Mar. 22, 2007

(30) Foreign Application Priority Data

Sep. 21, 2005  (JP) .............................. 2005-274105
Jul. 24, 2006  (JP) .............................. 2006-200798

(51) Int. Cl.
C30B 25/00  (2006.01)
C30B 28/12  (2006.01)
G01K 15/00  (2006.01)
C23C 16/00  (2006.01)

(52) U.S. Cl. ........................... 117/89; 117/94; 117/106; 118/715; 118/719; 118/724; 374/1

(58) Field of Classification Search .................... 117/14, 117/89, 94, 106, 201, 222; 118/715, 719, 118/724

See application file for complete search history.

(56) References Cited

U.S. PATENT DOCUMENTS

| | | | | |
|---|---|---|---|---|
| 3,172,792 A | * | 3/1965 | Handelman | 117/99 |
| 3,178,313 A | * | 4/1965 | Moest | 117/100 |
| 3,235,418 A | * | 2/1966 | Sirtl et al. | 117/93 |
| 3,316,121 A | * | 4/1967 | Lombos et al. | 117/86 |
| 3,567,895 A | * | 3/1971 | Paz | 219/667 |
| 3,666,553 A | * | 5/1972 | Arthur et al. | 148/33 |

(Continued)

FOREIGN PATENT DOCUMENTS

JP    11-51769 A    2/1999

(Continued)

OTHER PUBLICATIONS

English language translation of patent abstract 2000-269137.

*Primary Examiner*—Michael Komakov
*Assistant Examiner*—G. Nagesh Rao
(74) *Attorney, Agent, or Firm*—Greenblum & Bernstein P.L.C.

(57) ABSTRACT

An object of the invention is to calibrate an upper pyrometer for indirectly measuring a substrate temperature at the time of epitaxial growth in a comparatively short time and with accuracy to thereby improve the quality of an epitaxial substrate.

After calibrating an upper pyrometer by a thermocouple mounted to a temperature calibrating susceptor, a measured value of a lower pyrometer is adjusted to a calibrated value of the upper pyrometer. Then, a correlation line between substrate temperature indirectly measured by the upper pyrometer at the time of epitaxial growth onto a sample substrate and haze of a sample substrate measured immediately after epitaxial growth is set to indirectly measure a substrate temperature by the upper pyrometer at the time of epitaxial growth onto a mass-production substrate. Moreover, substrate temperature at the time of epitaxial growth onto the mass-production substrate is estimated by applying the haze of the mass-production substrate measured immediately after epitaxial growth to the correlation line and then a measured temperature of the upper pyrometer is adjusted to the estimated temperature.

3 Claims, 6 Drawing Sheets

U.S. PATENT DOCUMENTS

| | | | | |
|---|---|---|---|---|
| 3,751,310 A | * | 8/1973 | Cho | 117/105 |
| 3,830,654 A | * | 8/1974 | Cho | 117/105 |
| 4,806,321 A | * | 2/1989 | Nishizawa et al. | 118/666 |
| 5,213,985 A | * | 5/1993 | Sandroff et al. | 438/7 |
| 5,568,978 A | * | 10/1996 | Johnson et al. | 374/161 |
| 5,710,407 A | * | 1/1998 | Moore et al. | 219/405 |
| 6,596,973 B1 | * | 7/2003 | Donald et al. | 219/390 |
| 6,638,876 B2 | * | 10/2003 | Levy et al. | 438/769 |
| 6,703,592 B2 | * | 3/2004 | Van Bilsen | 219/497 |
| 6,924,463 B2 | * | 8/2005 | Donald et al. | 219/390 |
| 2007/0062439 A1 | * | 3/2007 | Wada et al. | 117/89 |
| 2007/0291816 A1 | * | 12/2007 | Volf et al. | 374/1 |

FOREIGN PATENT DOCUMENTS

JP        2000-269137        9/2000

* cited by examiner

TEMPERATURE CONTROL METHOD OF EPITAXIAL GROWTH APPARATUS

BACKGROUND OF THE INVENTION

1. Field of the Invention

The present invention relates to a method for controlling the temperature when growing an epitaxial layer on a substrate by using an epitaxial growth apparatus.

2. Description of the Related Art

There has been disclosed a wafer handling method which heats the inside of the treatment chamber of an epitaxial growth apparatus by heating means, conveys a substrate into the heated treatment chamber, and controls heating by heating means so that the temperature difference between the surface and the back of the substrate is decreased in order to prevent the warpage of the substrate while the substrate is conveyed (for example, refer to Patent Document 1). In this method, the heating means is a halogen lamp arranged to the upside and downside of the treatment chamber and surface temperatures of the substrate heated by the halogen lamp and a susceptor for supporting the substrate in the treatment chamber are measured by a pyrometer. Specifically, the pyrometer is constituted so as to measure surface temperatures of the substrate and susceptor in the treatment chamber by receiving thermal emission energy from the substrate and susceptor. Moreover, in order to convey the substrate to the treatment chamber, a conveying robot and lift mechanism are used.

In the case of the wafer handling method thus constituted, the halogen lamp is controlled based on a detection output of the pyrometer, that is, heating by the halogen lamp is controlled so that the temperature difference between the surface and the back of the substrate is decreased during conveyance. Therefore, when conveying the substrate to the treatment chamber, it is possible to prevent the warpage generated in the substrate supported by the conveying robot and lift mechanism.

[Patent Document 1] Japanese Unexamined Patent Application Publication No. 2000-269137 (claim 4, Paragraphs [0016] to [0022], [0037], FIG. 1)

However, in the case of the conventional wafer handling method shown in Patent Document 1, a pyrometer serving as a radiation thermometer is used. Because of the characteristics of the radiation thermometer, that is, because temperature is calculated by using infrared energy and emissivity to be fluctuated due to an external factor, indirectly measured temperature by the radiation thermometer is changed with time and shifted from actual substrate temperature. Therefore, it has been necessary to regularly directly measure the substrate temperature in the treatment chamber by using a susceptor having a thermocouple and calibrate the radiation thermometer. Because the calibration of the radiation thermometer requires substantial time (two to three days), there have been problems that it is impossible to calibrate the radiation thermometer after epitaxial growth treatment every time and that it is impossible to grow an epitaxial layer on a mass-production substrate while the radiation thermometer is calibrated. Therefore, at the time of regular maintenance once for two years or when extremely abnormal quality of a mass-production substrate on which an epitaxial layer is grown occurs, only confirmation of temperature and calibration of the radiation thermometer are performed. Therefore, frequencies of these operations are lowered and it is impossible to monitor the shift of indirectly measured temperature from actual substrate temperature by the radiation thermometer. Therefore, there has been a problem that the quality of the mass-production substrate on which an epitaxial layer is grown is gradually deteriorated.

Moreover, in the case of the above conventional wafer handling method shown in Patent Document 1, the substrate temperature in the treatment chamber is indirectly measured by a radiation thermometer through transparent top and bottom walls made of quartz. Therefore, when the transparent top and bottom walls are contaminated, the indirectly measured temperature by the radiation thermometer is shifted from an actual substrate temperature and there has been a problem that the quality of the epitaxial substrate is deteriorated.

SUMMARY OF THE INVENTION

It is an object of the present invention to provide a temperature control method of an epitaxial growth apparatus capable of accurately calibrating an upper pyrometer (radiation thermometer) for indirectly measuring a substrate temperature at the time of epitaxial growth for a comparatively short time such as several hours and thereby, improving the quality of a mass-production substrate on which an epitaxial layer is grown.

It is another object of the present invention to provide a temperature control method of an epitaxial growth apparatus capable of monitoring the shift of indirectly measured temperature by an upper pyrometer (radiation thermometer) from an actual substrate temperature while growing an epitaxial layer on a mass-production substrate in the operation process of actual production and thereby applying epitaxial growth to a mass-production substrate at a temperature very close to a set temperature.

It is still another object of the present invention to provide a temperature control method of an epitaxial growth apparatus capable of accurately measuring haze by measuring the haze of a sample substrate immediately after epitaxial growth and the haze of a mass-production substrate immediately after epitaxial growth by a laser-surface inspection apparatus.

As shown in FIGS. 1 to 3, the invention of claim 1 is an improved method for controlling the temperature of an epitaxial growth apparatus having an upper pyrometer above the mass-production susceptor and a lower pyrometer below the mass-production susceptor to grow an epitaxial layer on a mass-production substrate mounted on a susceptor based on the above pyrometers.

The characterized configuration includes calibrating the upper pyrometer by a thermocouple mounted to a previously-set temperature calibrating susceptor instead of the mass-production susceptor, adjusting the measured value of the lower pyrometer to the calibrated value of the upper pyrometer, setting a correlation line between the substrate temperature indirectly measured by the upper pyrometer at the time of epitaxial growth onto the sample substrate previously mounted on the mass-production susceptor instead of the mass-production substrate and the haze of the sample substrate measured immediately after epitaxial growth, indirectly measuring a substrate temperature $T_x$ by the upper pyrometer at the time of epitaxial growth onto the mass-production substrate, applying the haze of the mass-production substrate measured immediately after epitaxial growth to the correlation line to estimate the substrate temperature $T_y$ at the time of epitaxial growth onto the mass-production substrate, and performing calibration to adjust the measured temperature $T_x$ of the upper pyrometer to the estimated temperature $T_y$.

In the case of the temperature control method of an epitaxial growth apparatus of claim 1, it is possible to accurately estimate the substrate temperature at the time of epitaxial growth onto the mass-production substrate from correlation by obtaining the correlation between the substrate temperature at the time of epitaxial growth onto the sample substrate and the haze of the sample substrate immediately after epitaxial growth and thereafter measuring the haze of the mass-production substrate immediately after epitaxial growth onto the mass-production substrate. Thereby, it is possible to monitor the shift of the set temperature of the substrate at the time of epitaxial growth on the mass-production substrate from an actual temperature and calibrate the upper pyrometer in a short time. Moreover, in the operation process of actual production, it is possible to monitor the shift of the indirectly measured temperature Tx by the upper pyrometer from an actual substrate temperature while growing the epitaxial layer on the mass-production substrate. Therefore, it is possible to apply epitaxial growth to the mass-production substrate at a temperature very close to a set temperature.

The invention of claim 2 belongs to the invention of claim 1, which is characterized by measuring the haze of the sample substrate immediately after epitaxial growth and the haze of the mass-production substrate immediately after epitaxial growth by a laser surface inspection apparatus as shown in FIGS. 1 to 3.

Generally, cleaning is performed after epitaxial growth treatment. However, a haze value is changed depending on a cleaning condition. Therefore, in the case of the temperature control method of an epitaxial growth apparatus of claim 2, it is possible to accurately measure haze because the haze of the sample substrate immediately after epitaxial growth and before cleaning and the haze of the mass-production substrate immediately after epitaxial growth are measured by the laser surface inspection apparatus, respectively.

The invention of claim 3 belongs to the invention of claim 1, which is characterized by performing calibration to adjust the above indirectly-measured temperature Tx of the mass-production substrate to the above estimated temperature Ty of the mass-production substrate when the difference between the temperature Tx of the mass-production substrate at the time of epitaxial growth indirectly measured by the upper pyrometer and the above estimated temperature Ty of the mass-production substrate estimated by applying the haze of the mass-production substrate to a correlation line becomes 5° C. or higher.

In the case of the temperature control method of an epitaxial growth apparatus of claim 3, calibration to adjust the above indirectly measured temperature Tx to the above estimated temperature Ty when the difference between the indirectly measured temperature Tx of the mass-production substrate at the time of the above epitaxial growth and the estimated temperature Ty of the mass-production substrate at the time of epitaxial growth becomes 5° C. or higher. Therefore, it is possible to apply epitaxial growth to a mass-production substrate at a temperature within ±5° C. for a set temperature.

As described above, according to the present invention, an upper pyrometer is calibrated by a thermocouple mounted to a temperature calibrating susceptor, then the measured value of a lower pyrometer is adjusted to the calibrated value of the upper pyrometer, a correlation line between the substrate temperature indirectly measured by the upper pyrometer at the time of epitaxial growth onto a sample substrate and the haze of a sample substrate measured immediately after epitaxial growth is set, substrate temperature is indirectly measured by the upper pyrometer at the time of epitaxial growth onto the mass-production substrate, the substrate temperature at the time of epitaxial growth onto the mass-production substrate is estimated by applying the haze of the mass-production substrate measured immediately after epitaxial growth to the above correlation line, and moreover the calibration to adjust the measured temperature of the upper pyrometer to the above estimated temperature. Therefore, it is possible to monitor the shift of the set temperature of the substrate from an actual temperature at the time of epitaxial growth onto the mass-production substrate and calibrate the upper pyrometer in a short time. As a result, it is possible to apply epitaxial growth to the mass-production substrate while adjusting the set temperature to the actual temperature. Therefore, it is possible to improve the quality of an epitaxial substrate. Moreover, in the operation process of actual production, it is possible to monitor the shift of an indirectly measured temperature by the upper pyrometer from an actual substrate temperature while growing an epitaxial layer on the mass-production substrate. For this reason, it is possible to apply epitaxial growth to the mass-production substrate at a temperature very close to a set temperature. As a result, it is possible to restrain that slip occurs on the epitaxial layer, uniform a resistivity distribution due to increase of auto-dope quantity, and LPD (Light Point Defect) due to insufficient removal of an oxide film can be decreased. In this case, LPD represents all surface defects observed on the surface of an epitaxial layer by using a light scattering particle counter.

Moreover, by measuring the haze of a sample substrate immediately after epitaxial growth and the haze of a mass-production substrate immediately after epitaxial growth by a laser surface inspection apparatus, it is possible to exclude the harmful effect of haze change due to cleaning and accurately measure haze. As a result, it is possible to improve the accuracy of a haze correlation line.

Furthermore, when the difference between the temperature of a mass-production substrate at the time of epitaxial growth indirectly measured by an upper pyrometer and the temperature of a mass-production substrate at the time of epitaxial growth estimated by applying the haze of the mass-production substrate to a correlation line becomes 5° C. or higher, by applying the calibration for adjusting the indirectly-measured temperature of the mass-production substrate to the estimated temperature of the mass-production substrate, it is possible to apply epitaxial growth to the mass-production substrate at a temperature within ±5° C. for a set temperature. As a result, the above effects can be obtained that it is possible to restrain occurrence of slip onto the epitaxial layer and uniform the resistivity distribution due to increase of auto-dope quantity, and LPD due to insufficient removal of an oxide film can be decreased.

DETAILED DESCRIPTION OF THE PREFERRED EMBODIMENT

A preferred embodiment for executing the present invention is described below based on the accompanying drawings.

Figure 1:
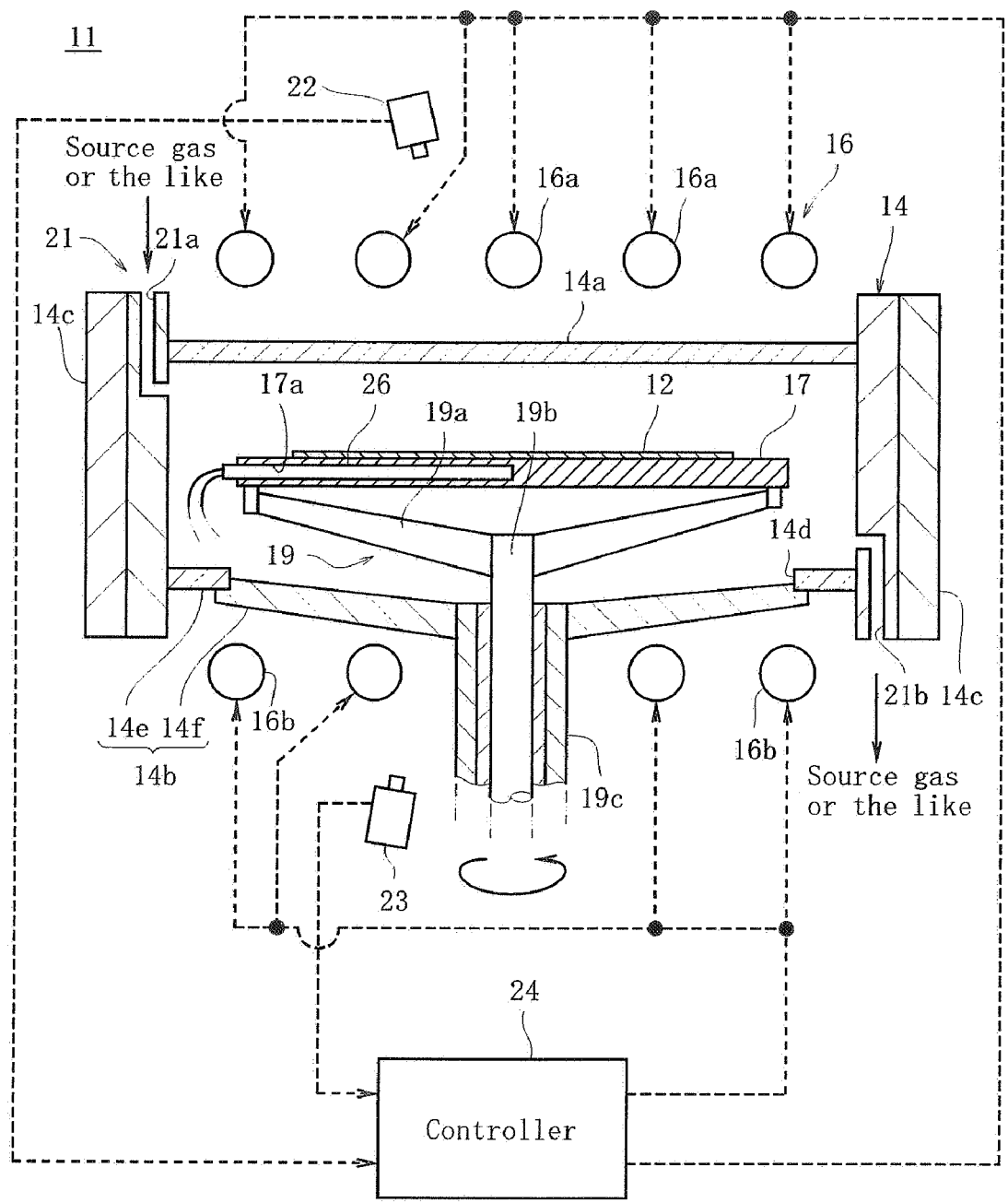
FIG. 1 is a sectional block diagram of an essential portion showing a state of housing a temperature calibrating susceptor and a sample substrate in the treatment chamber of an epitaxial growth apparatus of an embodiment of the present invention.
Figure 2:
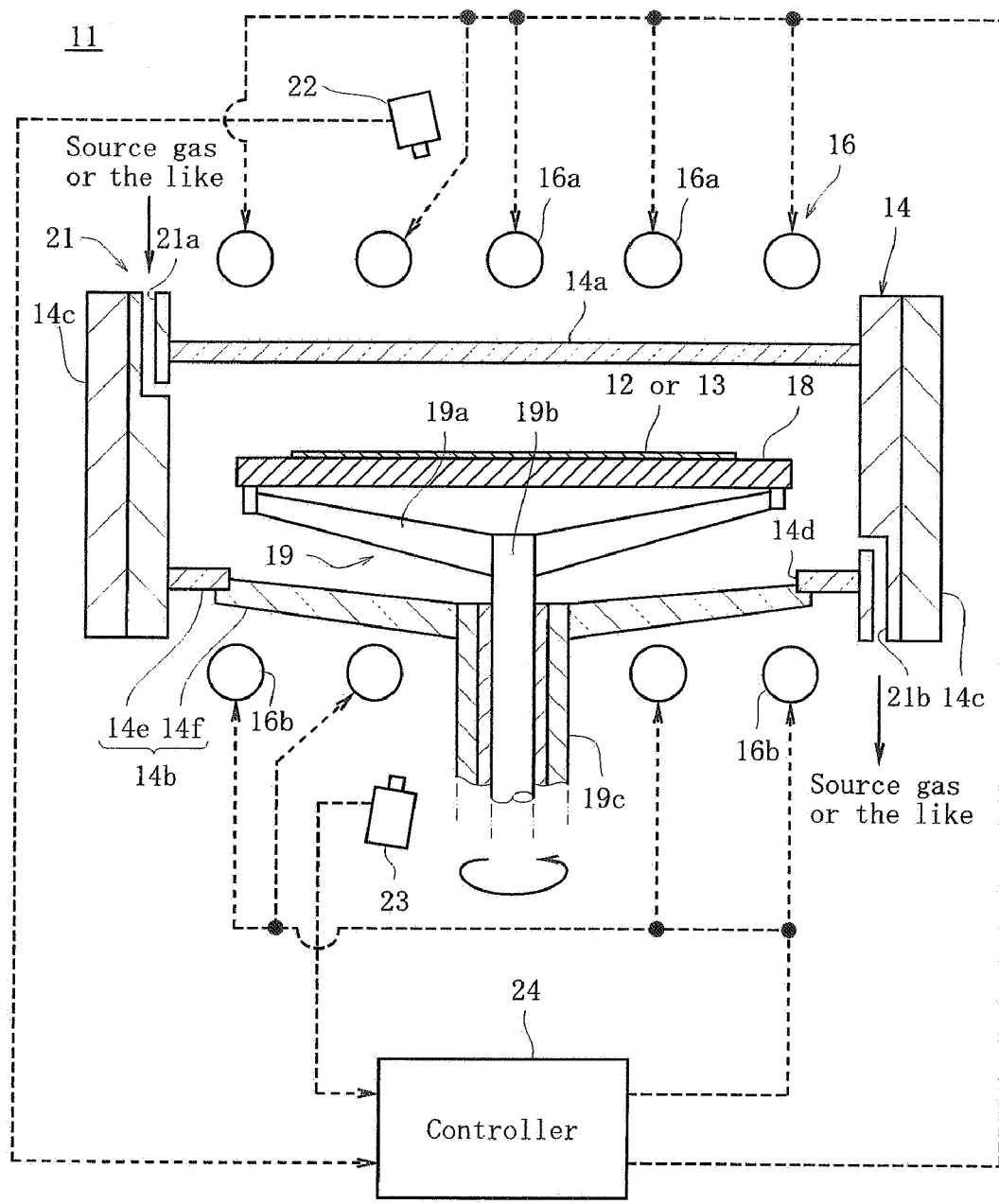
FIG. 2 is a sectional block diagram of an essential portion showing a state of housing a mass-production susceptor and sample substrate or mass-production substrate in a treatment chamber.

As shown in FIGS. 1 and 2, an epitaxial layer is grown on upsides of a sample silicon substrate 12 (hereafter referred to as sample substrate) and mass-production silicon substrate 13 (hereafter referred to as mass-production substrate) by using an epitaxial growth apparatus 11. The sample substrate 12 and mass-production substrate 13 are formed into the same shape from the same material. The epitaxial growth apparatus 11 is provided with a treatment chamber 14 for housing the sample substrate 12 or mass-production substrate 13, heating means 16 for heating the inside of the treatment chamber 14, a temperature calibrating susceptor 17 or mass-production susceptor 18 for mounting the sample substrate 12 or mass-production substrate 13, rise-fall rotation means 19 for supporting the temperature calibrating susceptor 17 or mass-production susceptor 18 and performing rise-fall rotation, gas supply means 21 for supplying gas for growing an epitaxial layer on the upside of the sample substrate 12 or mass-production substrate 13 to the treatment chamber 14, upper pyrometer 22 for indirectly measuring the temperature of the upside of the sample substrate 12 or mass-production substrate 13 in the treatment chamber 14, lower pyrometer 23 for indirectly measuring the temperature of the downside of the temperature calibrating susceptor 17 or mass-production susceptor 18 in the treatment chamber 14, and controller 24 for controlling the heating means 16 based on each detection output of the upper pyrometer 22 and lower pyrometer 23.

The above treatment chamber 14 has a transparent upper wall 14a made of quartz for covering the upside of the sample substrate 12 or mass-production substrate 13, transparent lower wall 14b made of quartz for covering the downside of the sample substrate 12 or mass-production substrate 13, and side wall 14c made of quartz for covering the periphery of the sample substrate 12 or mass-production substrate 13. The transparent lower wall 14b is constituted of a fixed lower wall 14e on which an opening 14d for housing the sample substrate 12 or mass-production substrate 13 in the treatment chamber 14 or taking it out from the treatment chamber 14 is formed and movable lower wall 14f for closing the opening 14d so that it can be opened. The heating means 16 has an upper lamp 16a constituted of a halogen lamp set above the transparent upper wall 14a along the transparent upper wall 14a by keeping a predetermined space and a lower lamp 16b constituted of a halogen lamp set below the transparent lower wall 14b along the transparent lower wall 14b by keeping a predetermined space. The rise-fall rotation means 19 has a plurality of acceptance tools 19a for holding the temperature calibrating susceptor 17 or mass-production susceptor 18, support shaft 19b for supporting these acceptance tools 19a, holding cylinder 19c for rotatably holding the support shaft 19b, the transparent lower wall 14f for closing the opening 14d fitted to the upper end of the support cylinder 19c so that it can be opened, moving means (not illustrated) for moving the holding cylinder 19c, and rotation means (not illustrated) for rotating the support shaft 19b set to the moving means. A thermocouple 26 (FIG. 1) is mounted to the temperature calibrating susceptor 17 so that the temperature of the temperature calibrating susceptor 17 housed in the treatment chamber 14 by the thermocouple 26 and heated by the heating means 16 can be directly measured. In the case of this embodiment, the thermocouple 26 is inserted into a hole 17a formed toward the center from the outer periphery of the temperature calibrating susceptor 17.

However, the gas supply means 21 has an introduction port 21a for introducing source gas such as silane gas formed on the upside of the side wall 14c to deposit single crystal silicon on the upside of the sample substrate 12 or mass-production substrate 13 and carrier gas into the treatment chamber 14 and discharge port 21b formed at the downside of the side wall 14c to discharge source gas and carrier gas passing through the upside of the sample substrate 12 or mass-production substrate 13 in the treatment chamber 14 formed at the downside of the side wall 14c from the treatment chamber 14. The upper pyrometer 22 is set above the upper lamp 16a and toward the upside of the sample substrate 12 or mass-production substrate 13 in the treatment chamber 14 and the lower pyrometer 23 is set below the lower lamp 14b and toward the downside of the temperature calibrating susceptor 17 or mass-production susceptor 18 in the treatment chamber 14. The upper pyrometer 22 measures the upside temperature of the sample substrate 12 or mass-production substrate 13 by means of receiving through a heat receiving plate the radiation energy emitted by the sample substrate 12 or mass-production substrate 13 which is heated by the upper lamp 16a and becomes high-temperature and converting the raised temperature into thermal electromotive force by a built-in thermocouple, which is a radiation thermometer for indirectly measuring the upside temperature of the sample substrate 12 or mass-production substrate 13 by indirectly using a thermocouple. The lower pyrometer 23 measures the downside temperature of the temperature calibrating susceptor 17 or mass-production susceptor 18 by means of receiving through a heat receiving plate the radiation energy emitted by the temperature calibrating susceptor 17 or mass-production susceptor 18 which is heated by the lower lamp 16b and becomes high-temperature and converting the raised temperature into thermal electromotive force by a built-in thermocouple, which is a radiation thermometer for indirectly measuring the downside temperature of the temperature calibrating susceptor 17 or mass-production susceptor 18 by indirectly using a thermocouple. Detection outputs of the upper pyrometer 22 and lower pyrometer 23 are connected to the control input of the controller 24 and control outputs of the controller 24 are respectively connected to the upper lamp 16a and lower lamp 16b. It is necessary to regularly calibrate the upper pyrometer 22 and lower pyrometer 23 because indirectly measured temperature by the upper pyrometer 22 or lower pyrometer 23 is changed with time and shifted from an actual substrate temperature because of its characteristics, that is, because of calculating temperature by using emittance which is fluctuated by infrared energy and an external factor.

Figure 3:
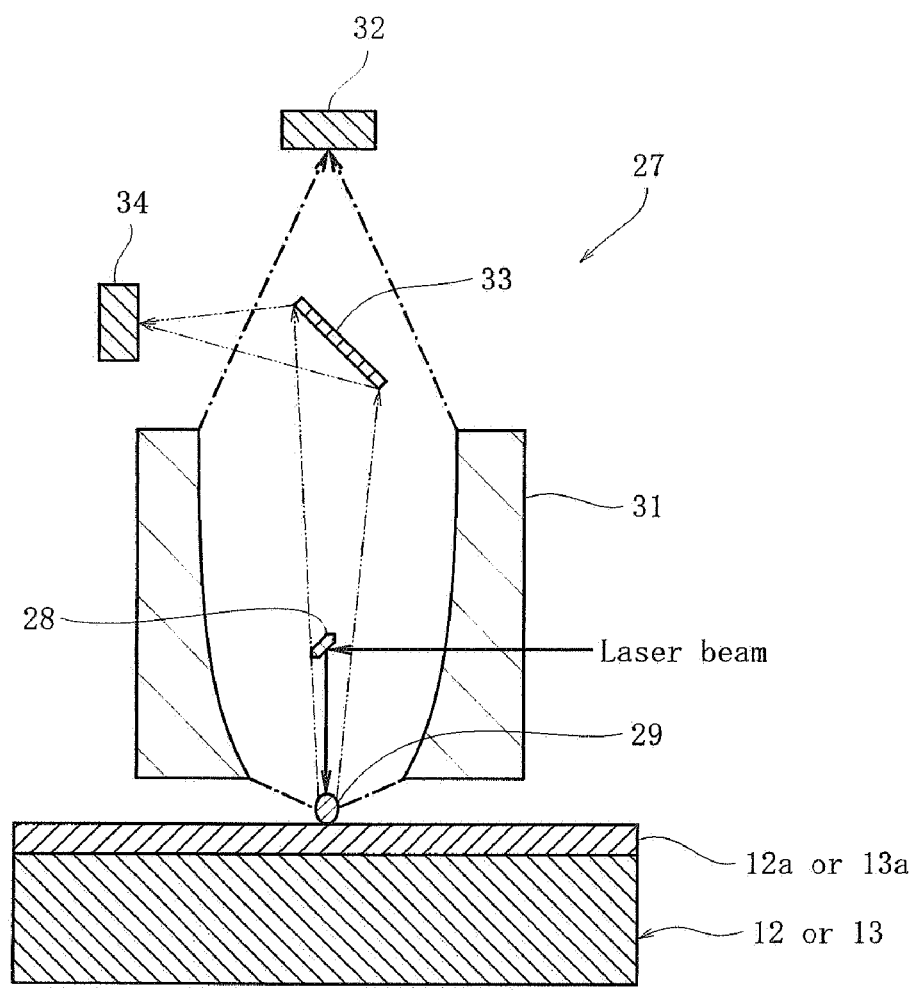
FIG. 3 is a block diagram showing a state of measuring the haze on the upside of an epitaxial layer immediately after epitaxial growth by a laser surface inspection apparatus.
Figure 4:
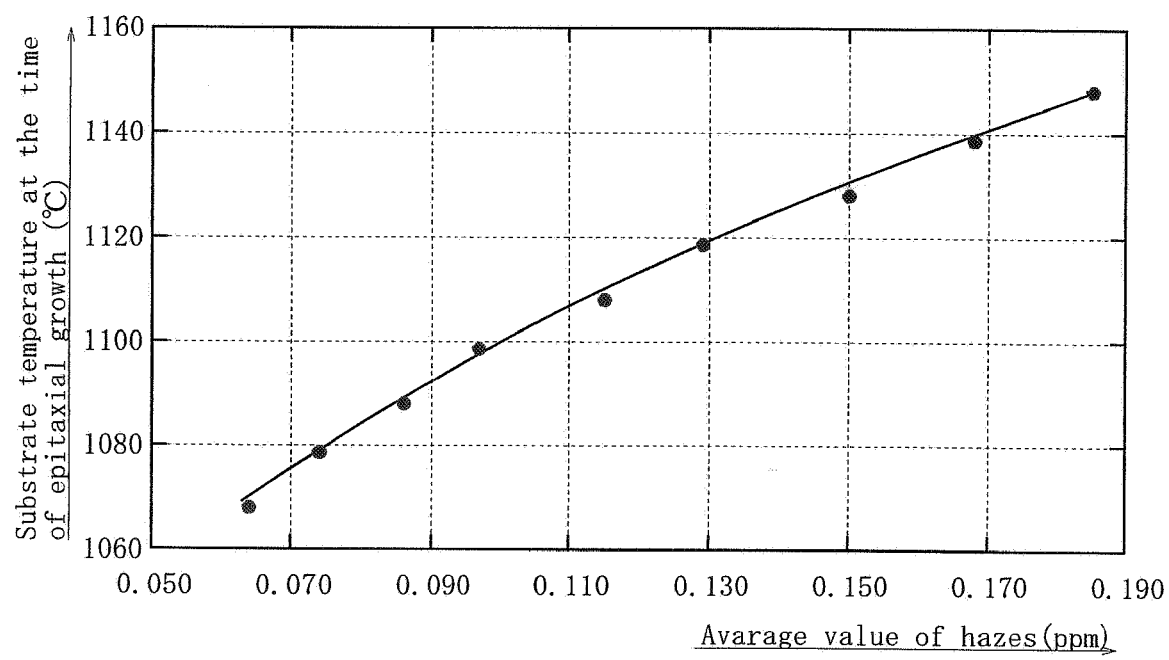
FIG. 4 is a diagram showing the correlation between the substrate temperature at the time of epitaxial growth and the average value of hazes immediately after epitaxial growth.
Figure 5:
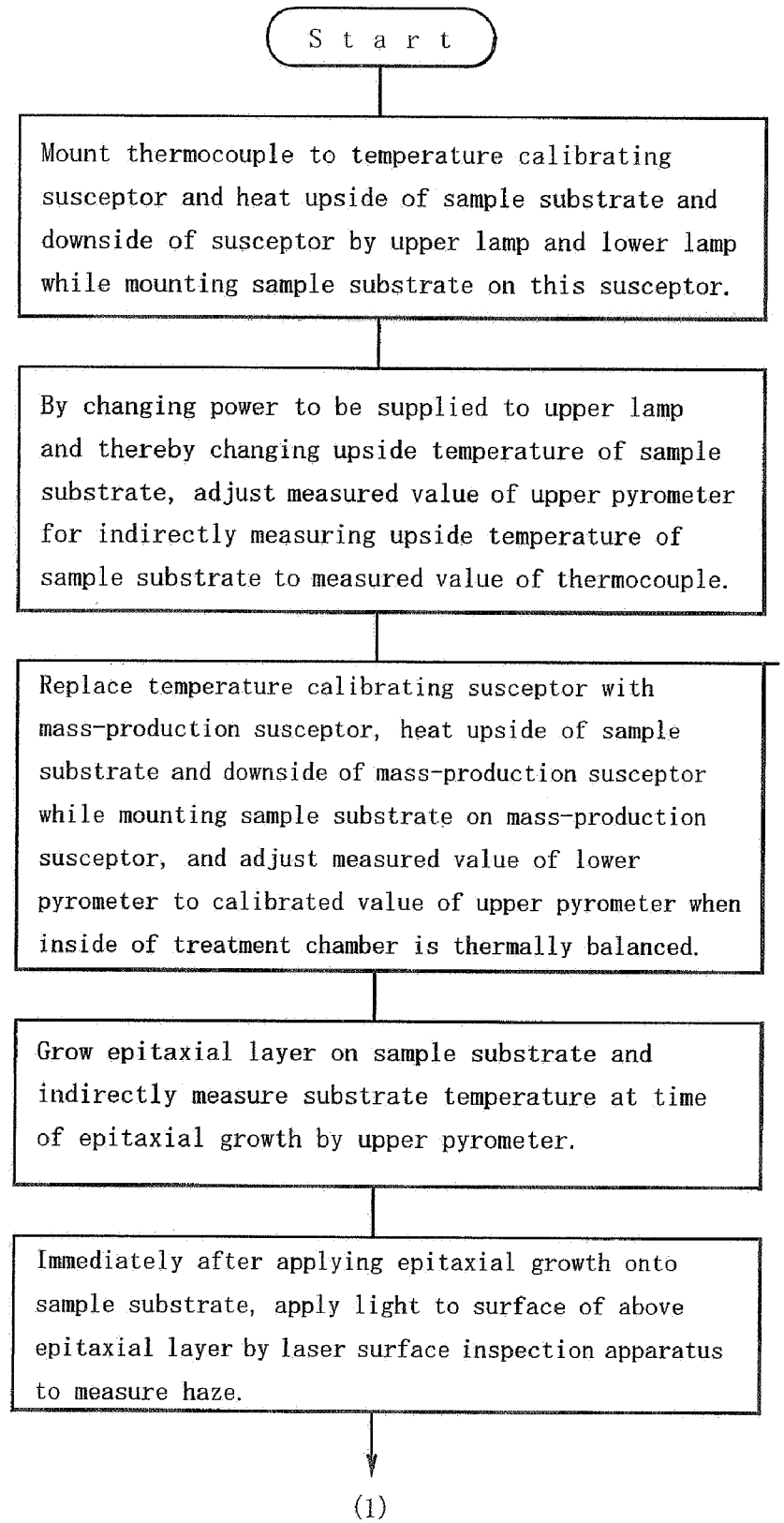
FIG. 5 is a flowchart showing the first half of a temperature control method of the present invention.
Figure 6:
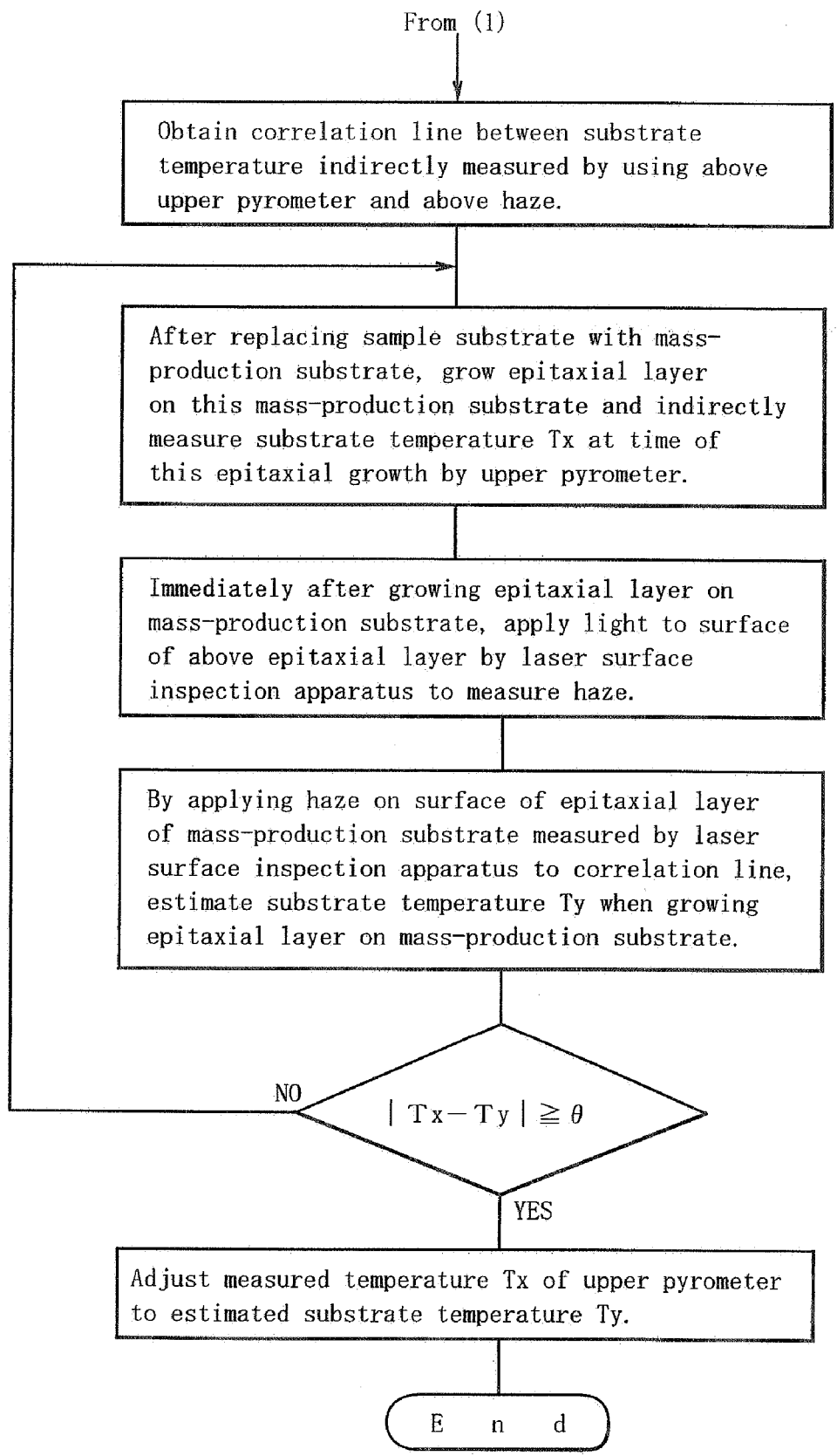
FIG. 6 is a flowchart showing the second half of the temperature control method of the present invention.

On the other hand, as shown in FIG. 3, immediately after epitaxial layers 12a and 13a are grown on the upside of the sample substrate 12 or mass-production substrate 13 and its growth step is completed, hazes on the upsides of the epitaxial layers 12a and 13a are measured by using the laser surface inspection apparatus 27. The laser surface inspection apparatus 27 is provided with beam generating means (laser tube) for generating a laser beam, lens 29 set closely to the upsides of the epitaxial layers 12a and 13a to refract and condense a laser beam generated by the beam generating means and reflected by an input light reflector 28 and apply the laser beam to the upsides of the epitaxial layers 12a and 13a, a wide concave mirror 31 for collecting most of laser beams reflected in various directions from the upsides of the epitaxial layers 12a and 13a, and wide photoelectric conversion element 32 for receiving laser beams collected by the wide concave mirror 31 and converting them into electrical signals. The wide concave mirror 31 is set above the epitaxial layers 12a and 13a so that the central axis of the mirror 31 coincides with the central axis of the lens 29. Moreover, symbol 33 in FIG. 3 denotes a narrow reflector for collecting only the light applied to the upsides of the epitaxial layers 12a and 13a and reflected almost in the vertical direction from the upsides of the epitaxial layers 12a and 13a and symbol 34 denotes a narrow photoelectric conversion element for receiving laser beams collected by the narrow reflector 33 and converting them into electrical signals.

There is described a method for controlling the temperature in the treatment chamber 14 by using thus-constituted epitaxial growth apparatus 11 and the laser surface inspection apparatus 27 based on FIG. 1 to 6.

First, the upper pyrometer 22 is calibrated by the thermocouple 26 set to the temperature calibrating susceptor 17 previously set instead of the mass-production susceptor 18. Specifically, the upside of the sample substrate 12 and the downside of the susceptor 17 are heated by the upper lamp 16a and lower lamp 16b while the thermocouple 26 is inserted into the hole 17a of the temperature calibrating susceptor 17 and the sample substrate 12 is mounted on the upside of the susceptor 17 (FIG. 1). In this case, after continuing to supply the predetermined power only for predetermined time to the upper lamp 16a, the power is changed step-by-step, the upside temperature of the sample substrate 12 is changed step-by-step, the upside temperature of the sample substrate 12 indirectly measured by the upper pyrometer 22 is compared with the central temperature in the thickness direction of the temperature calibrating susceptor 17 measured directly by the thermocouple 26. In this case, the time for continuously supplying predetermined power to the upper lamp 16a is at least the time until the temperature of the central portion in the thickness direction of the temperature calibrating susceptor 17 coincides with the upside temperature of the sample substrate 12. Moreover, the calibration is performed in which the measured value of the upper pyrometer 22 for indirectly measuring the upside temperature of the sample substrate 12 is adjusted to the measured value of the thermocouple 26 for directly measuring the central temperature in the thickness direction of the temperature calibrating susceptor 17.

Then, the measured value of the lower pyrometer 23 is adjusted to a calibrated value of the upper pyrometer 22. Specifically, the temperature calibrating susceptor 17 mounting the sample substrate 12 is taken out from the treatment chamber 14 to replace the temperature calibrating susceptor 17 with the mass-production susceptor 18 to which the thermocouple 26 is not mounted and the power is supplied to the upper lamp 16a and lower lamp 16b while the sample substrate 12 is mounted on the mass-production susceptor 18 to heat the upside of the sample substrate 12 and downside of the mass-production susceptor 18. When the predetermined time passes and the upside temperature of the sample substrate 12 becomes equal to the downside temperature of the mass-production susceptor 18, that is, when the inside of the treatment chamber 14 is thermally balanced, the measured value of the lower pyrometer 23 for indirectly measuring the downside temperature of the mass-production susceptor is adjusted to the calibrated value of the upper pyrometer 22.

Then, a correlation line between the substrate temperature indirectly measured by the upper pyrometer 22 at the time of epitaxial growth onto the sample substrate 12 mounted on the mass-production susceptor 18 and the haze of the sample substrate 12 measured immediately after epitaxial growth is set. Specifically, after the epitaxial layer 12a is grown on the sample substrate 12 while keeping the upside temperature of the sample substrate 12 at a predetermined value, the haze on the upside of the epitaxial layer 12a of the sample substrate 12 is measured by using the laser surface inspection apparatus 27 (FIGS. 2 and 3). Measurement of the haze is described below in detail. First, a laser beam generated by beam generating means is reflected by the input light reflector 28 and refracted and condensed by a lens and applied to the upside of the epitaxial layer 12a. Then, laser beams reflected from the upside of the epitaxial layer 12 are collected by the wide concave mirror 31 and the collected laser beams are received by the wide photoelectric conversion element 32 and converted into electrical signals. Thereby, the haze (face roughness) on the upside of the epitaxial layer 12a of the sample substrate 12 is measured. The above measurement is repeated several times. That is, by changing the upside temperature of the sample substrate 12, measurement of the haze on the upside of the epitaxial layer 12a of the sample substrate 12 is repeated several times. Thereby, a plurality of points showing the relation between the upside temperature of the sample substrate 12 and the haze on the upside of the epitaxial layer 12a are obtained. As a result, it is possible to set the correlation line (FIG. 4) between the upside temperature of the sample substrate 12 and the haze of the sample substrate 12 based on these points. Haze can be accurately measured because the haze of the sample substrate 12 immediately after the epitaxial growth and before cleaning and the haze of the mass-production substrate 13 immediately after epitaxial growth are measured by the laser surface inspection apparatus 27. As a result, it is possible to improve the accuracy of the correlation line of haze. Because the value of the haze of the above sample substrate 12 is a value depending on the laser generating means (laser tube) of the laser surface inspection apparatus 21, a correlation expression obtained from the above correlation line is necessary every laser tube. Moreover, the correlation expression can be approximated by a quadratic expression. In this case, a correlation coefficient is 0.99 or more (0.998 in FIG. 4). Furthermore, it is allowed that the above correlation line is a curved line or a straight line.

After setting of the above correlation line is completed, the substrate temperature Tx is indirectly measured by the upper pyrometer 22 at the time of epitaxial growth onto the mass-production substrate 13. Specifically, the mass-production substrate 13 is housed in the treatment chamber 14 to grow the epitaxial layer 13a on the mass-production substrate 13 (FIGS. 2 and 3). The substrate temperature Tx at the time of the epitaxial growth 13a is indirectly measured by the upper pyrometer 22. Then, the substrate temperature Ty at the time of epitaxial growth onto the mass-production substrate 13 is estimated by applying the haze of the mass-production substrate 13 measured immediately after epitaxial growth to the above correlation line. Specifically, immediately after the growth of the epitaxial layer 13a onto the mass-production substrate 13 is completed, the haze of the mass-production substrate 13 is measured by using the laser surface inspection apparatus 27 and thereby applying light to the upside of the epitaxial layer 13a (FIG. 3). The haze of the mass-production substrate 13 is measured similarly to the case of the above method for measuring the haze of the sample substrate 12. Moreover, after estimating the substrate temperature Ty at the time of epitaxial growth onto the mass-production substrate 13 by applying the haze of the mass-production substrate 13 to the above correlation line, the difference between the indirectly-measured temperature Tx by the upper pyrometer 22 and the estimated temperature Ty applied to the above correlation line is obtained. Furthermore, when the difference θ between the above indirectly-measured temperature Tx and the above estimated temperature Ty becomes a predetermined value or more, calibration for adjusting the measured temperature Tx of the upper pyrometer 22 to the above estimated temperature Ty is performed. Specifically, by considering the frequency in which the difference θ between the indirectly-measured temperature Tx and the above estimated temperature Ty occurs and the estimated accuracy of temperature, calibration for adjusting the measured temperature Tx of the upper pyrometer 22 to the above estimated temperature Ty is performed when the above difference θ becomes 5° C. or higher. Thereby, because epitaxial growth can be applied to the mass-production substrate at a temperature within ±5° C. for a set temperature, it is possible to restrain occurrence of slip on the epitaxial layer 13a, uniform a resistivity distribution due to increase of auto-dope quantity, and decrease LPD due to insufficient removal of an oxide film.

As described above, in the temperature control method of the epitaxial growth apparatus 11 thus constituted, it is possible to accurately estimate the substrate temperature at the time of epitaxial growth by measuring the haze of the mass-production substrate 13 immediately after epitaxial growth onto the mass-production substrate 13 in accordance with the correlation between the substrate temperature at the time of epitaxial growth onto the sample substrate 12 and the haze of the sample substrate 12 immediately after epitaxial growth onto the mass-production substrate 13. Thereby, it is possible to monitor the shift of the set temperature of a substrate at the time of epitaxial growth on the mass-production substrate 13 from actual temperature and calibrate the upper pyrometer 22 in a short time (approx. 30 min). As a result, while the set temperature is adjusted to an actual temperature, it is possible to grow the epitaxial layer 13a on the mass-production substrate. Therefore, it is possible to improve the quality of an epitaxial substrate. Moreover, in the operation process of actual production, it is possible to monitor the shift of the indirectly-measured temperature Tx by the upper pyrometer 22 from an actual substrate temperature while growing the epitaxial layer 13a on the mass-production substrate 13. Therefore, it is possible to apply epitaxial growth to the mass-production substrate at a temperature very close to the set temperature. As a result, advantages can be obtained that it is possible to obtain the above effects, that is, occurrence of slip on the epitaxial layer 13a can be restrained, uniform the resistivity distribution due to increase of auto-dope quantity, and decrease LPD due to insufficient removal of an oxide film.

Though a silicon substrate is used as a substrate in the case of the above embodiment, it is also possible to apply to any one of a SiGe substrate, SiC substrate, and Ge substrate.

What is claimed is:

1. A method for controlling the temperature of an epitaxial growth apparatus having an upper pyrometer above a mass-production susceptor and a lower pyrometer below the mass-production susceptor to grow an epitaxial layer on a mass-production substrate mounted onto the susceptor based on the temperature readings of both the upper and lower pyrometers, comprising:

performing a first calibration for calibrating the upper pyrometer by a thermocouple mounted to a temperature calibrating susceptor previously set in place of the mass-production susceptor;

adjusting a measured value of the lower pyrometer to a calibrated value of the upper pyrometer;

setting a correlation line between a temperature of a sample substrate indirectly measured by the upper pyrometer at the time of epitaxial growth onto the sample substrate previously mounted onto the mass-production susceptor instead of the mass-production substrate and haze of the sample substrate measured immediately after epitaxial growth;

indirectly measuring a temperature (Tx) of the mass production substrate by the upper pyrometer at the time of epitaxial growth onto the mass-production substrate;

estimating a temperature (Ty) of the mass production substrate at the time of epitaxial growth onto the mass-production substrate by applying the haze of the mass-production substrate measured immediately after the epitaxial growth to the correlation line; and performing a second calibration for adjusting the measured temperature (Tx) of the upper pyrometer to the estimated temperature (Ty) of the mass production substrate.

2. The method according to claim 1 wherein each of the haze of the sample substrate and the haze of the mass-production substrate is measured immediately after epitaxial growth by using a laser surface inspection apparatus.

3. The method according to claim 1, wherein the calibration for adjusting the temperature (Tx) of the mass-production substrate indirectly measured to the estimated temperature (Ty) of the mass-production substrate is carried out when the difference between the temperature (Tx) of the mass-production substrate at the time of epitaxial growth indirectly measured by the upper pyrometer and the temperature (Ty) of the mass-production substrate at the time of epitaxial growth estimated by applying the haze of the mass-production substrate to a correlation line becomes 5° C. or higher.

* * * * *